United States Patent
Holaday et al.

(10) Patent No.: US 6,473,700 B1
(45) Date of Patent: Oct. 29, 2002

(54) APPARATUS FOR USE IN A LOGIC ANALYZER FOR COMPRESSING DIGITAL DATA FOR WAVEFORM VIEWING

(75) Inventors: David A. Holaday, Cornelius; Ken N. Nguyen, Beaverton; Glenn R. Johnson, Aloha, all of OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/525,208

(22) Filed: Mar. 14, 2000

Related U.S. Application Data

(60) Provisional application No. 60/125,412, filed on Mar. 22, 1999.

(51) Int. Cl.[7] .............................................. G01R 13/00
(52) U.S. Cl. ............................ 702/66; 702/67; 702/70; 702/79; 375/224; 341/76
(58) Field of Search ................ 702/66, 67, 70, 702/79; 375/224; 341/76

(56) References Cited

U.S. PATENT DOCUMENTS 4,608,652 A * 8/1986 Yokokawa et al. ......... 364/521
5,347,540 A * 9/1994 Karrick ......................... 375/10

* cited by examiner

Primary Examiner—John S. Hilten
Assistant Examiner—Stephen J. Cherry
(74) Attorney, Agent, or Firm—Thomas F. Lenihan

(57) ABSTRACT

In a logic analyzer or similar binary signal-analyzing instrument, hardware circuitry, such as an ASIC, or other dedicated hardware, is used to perform waveform compression and summarization more rapidly than it could be done by software alone. The hardware is used to perform the compression of the data and to summarize its behavior for visual display. In one embodiment, the hardware starts from a given memory address and compares current timestamp values with final timestamp values to determine the length of the timeslice. Within the timeslice, all of the data is compared to determine whether it remains the same throughout the timeslice or whether it changes. The same approach can be used on violation data, such as glitches and setup and hold violations.

3 Claims, 3 Drawing Sheets

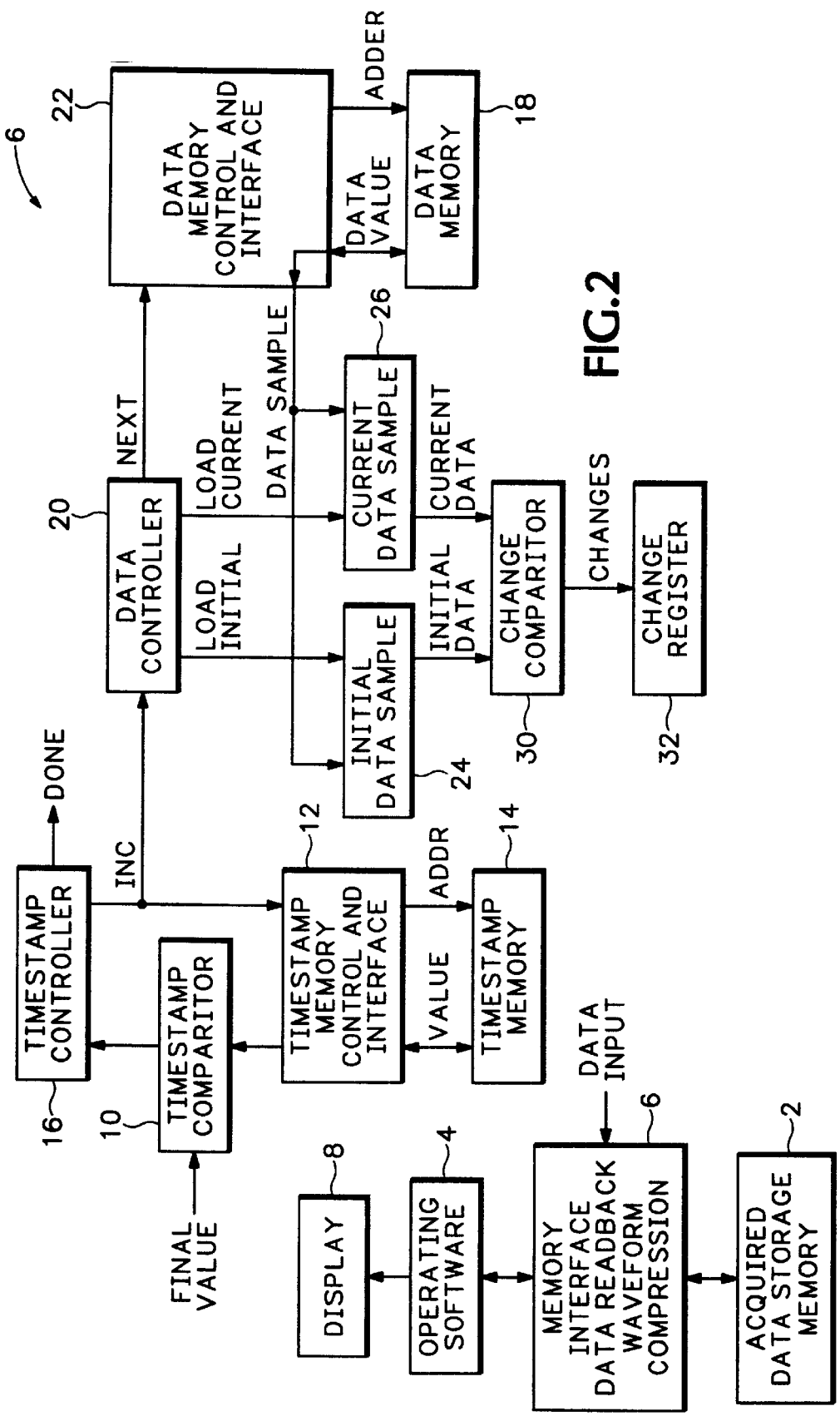

APPARATUS FOR USE IN A LOGIC ANALYZER FOR COMPRESSING DIGITAL DATA FOR WAVEFORM VIEWING

This application claims benefit of provisional application Ser. No. 60/125,412 filed Mar. 22, 1999.

FIELD OF THE INVENTION

This invention relates to compression of digital waveform data for viewing in a logic analyzer, and more particularly to an arrangement that provides such compression in much less time than is possible in apparatus according to the prior art.

BACKGROUND OF THE INVENTION

A modern logic analyzer may be implemented on electronic circuit boards (ECBs), or cards, mounted in a card cage. One of these cards typically is the controller card for controlling the logic analyzer system, and is in reality a PC on a card. The controller on this card is usually a relatively powerful PC compute engine, such as an Intel 266 MMX, or other suitable microprocessor. The other cards in the logic analyzer system are acquisition modules for acquiring and storing digital data for evaluation and display. Clock, control, and data signals are coupled between each of the ECBs by means of a backplane.

Memory depth has been growing steadily since the introduction of logic analyzers. Consider a modern logic analyzer having a memory depth of 400 Mbytes of data. Such a memory can be visualized as an array of memory locations 16 million rows long, and 196 bits wide (e.g. 136 bits of digital data, 52 time stamp bits, and 8 flag bits). This data must be compressed for display on a display screen. Recall that a display pixel is the smallest picture element capable of being illuminated on a display screen. A typical display screen has about 800 display pixels per horizontal line. With such a logic analyzer and display screen, and depending on the particular settings chosen, there could be any number from zero to 1 million samples per pixel.

Heretofore, logic analyzer waveform generation calculations have been performed in software, and the time required to perform these sequential operations has posed a limitation on the overall performance of the logic analyzers using that approach. Simply improving the PC compute engine does not address all limitations of the system. One such limitation has been the necessity of moving substantially all of the data across the backplane for processing by the controller PC. Unfortunately, state-of-the-art processors can have no effect on backplane or bus interfaces and standards, because those interfaces and standards exhibit inherent data limits. One might think that a solution would be to put a powerful PC on each acquisition module to reduce the amount of data transfer by performing all of the data evaluation on the acquisition module. However, this approach does not solve the problem adequately for several reasons. First, a powerful PC would still be required to control all of the acquisition modules, and to control display of the processed data. Second, even if the main PC controller were to be duplicated on each acquisition module, the total time required to evaluate the samples per pixel would not be reduced to a significant degree due to the limitations of performing data evaluation in software.

Note that the word "pixel" also has a secondary meaning which is a term of art in the logic analyzer field. Hereinafter, when the term "pixel" is used it actually refers to a variable height column of display pixels. One must evaluate the sample data to determine whether the pixel associated with that data should be drawn as a logic one (i.e., illuminate the top most display pixel in its column), a logic zero (i.e., illuminate the bottom most display pixel in its column), or as an edge (i.e., illuminate all display pixels in their column), indicating a change of state from a low to a high, or a high to a low.

In prior art logic analyzers, in order to evaluate the data, software running on the main PC would determine the time span of the pixel on the basis of the user's selection of a horizontal time scale. The software would determine which samples fell within the time span of each pixel. The software processes would begin with the first sample and check every sample in every channel within the pixel time span to determine the state of each sample during each sub-interval, i.e., whether it was always "hi", always "low", or made a "transition" from one state to the other. This process would also be informed of any applicable violation data saved in connection with any channel during one of the sub-intervals comprising the timeslice. Violation data, which is usually determined by hardware, includes glitches or an improper setup or hold time. From the foregoing information, the software would determine how to represent each channel during that timeslice in the logic analyzer display. This whole procedure is then repeated for every pixel column (timeslice) across the screen. Thus, this overall process requires substantially all of the data to be moved across the backplane to the PC card, requires a huge number of read and compare operations in the PC, and necessarily consumes a large amount of time, typically on the order of four to five minutes.

What is needed is apparatus capable of performing the evaluation of up to one million samples per pixel in a much shorter time.

BRIEF SUMMARY OF THE INVENTION

In accordance with the present invention, hardware circuitry is loaded with memory address related data, and is used to perform waveform compression more rapidly than could be done by software alone. Compression entails evaluating the data from a number of acquired data points on one channel over a period of time to determine if the data changed state during the period of time. The resulting highly compressed data is summarized to produce pixel illumination data. The pixel illumination data, and not the raw data, is conveyed to a controller for display.

BRIEF DESCRIPTION OF THE DRAWING

FIG. 1 is a simplified block diagram illustrating a logic analyzer architecture suitable for implementing the procedure of the present invention.

FIG. 2 is a block diagram of one embodiment of circuitry used for compressing waveform data in accordance with the invention.

DETAILED DESCRIPTION OF THE INVENTION

Figure 3:
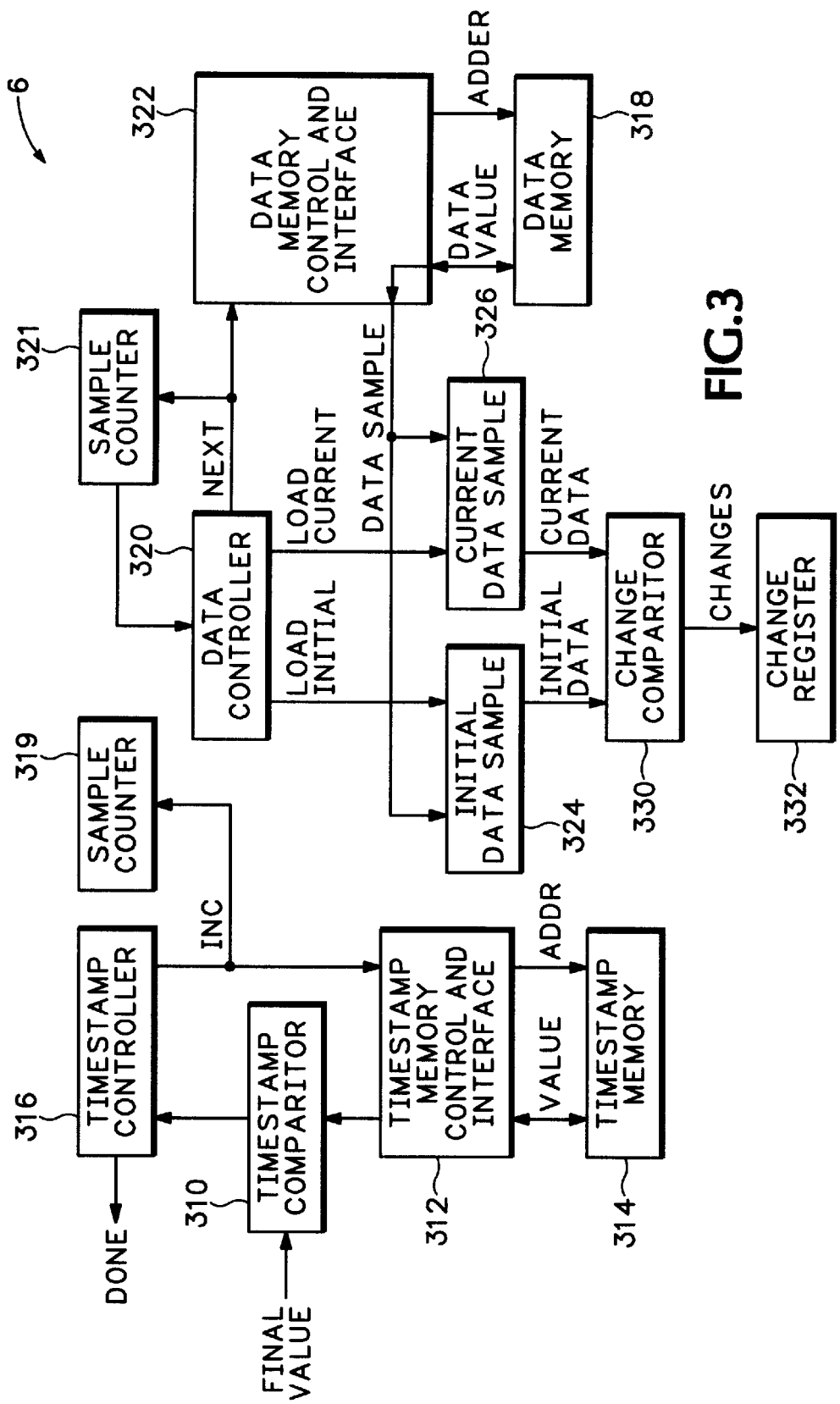
FIG. 3 is a block diagram of another embodiment of circuitry used for compressing waveform data in accordance with the invention.

FIG. 1 is a simplified high-level block diagram illustrating a logic analyzer architecture suitable for implementing the present invention. An acquisition data storage memory 2 receives input data from a memory interface 6, which receives data input from acquisition circuitry (not shown). Under the control of operating software 4, the memory interface circuitry 6 either compresses the data for waveform display on a display 8, or reads the uncompressed data from the acquisition data storage memory 2.

FIG. 2 is a block diagram of one embodiment of circuitry suitable for use as memory interface 6, for data read back and waveform compression. This circuitry can compress a number of samples in a particular timeslice so that they may be summarized by a notation in a single pixel column of the display. A timestamp comparator 10 is pre-programmed (e.g., by software) with the FINAL VALUE, i.e., the value of the final timestamp for the current timeslice. The timestamp memory control and interface 12 produces successive ADDResses, which cause timestamp memory 14 to send a new current timestamp VALUE to the timestamp comparator 10 where it is compared to the FINAL VALUE. So long as the VALUE does not exceed the FINAL VALUE, the timestamp controller 16 is enabled to continue producing INC signals. When the timestamp controller 16 receives a signal from the timestamp comparator 10 indicating that the current timestamp VALUE is greater than the FINAL VALUE, the timestamp controller 16 ceases to output INC signals, and instead makes DONE active.

Upon receiving the first INC signal, the data controller 20 generates an active LOAD INITIAL signal. The LOAD INITIAL signal causes the first DATA SAMPLE to be loaded into the initial data sample register 24. In response to every following INC signal the data controller 20 generates an active LOAD CURRENT signal. Each INC signal also causes the data controller 20 to output a NEXT signal to the data memory control and interface 22. In response to the NEXT signal, the data memory control and interface 22 updates the ADDRess supplied to the data memory 18, which in turn supplies a new DATA VALUE back to the data memory control and interface 22, where it is used to update the DATA SAMPLE output.

The active LOAD CURRENT signals causes the then current DATA SAMPLE to be loaded into the current data sample register 26. Change comparator 30 constantly compares the CURRENT DATA to the INITIAL DATA and generates an active CHANGE signal whenever they are not equal. The CHANGE REGISTER 32 latches and holds any active CHANGE signal, and thereafter produces an active CHANGED signal at its output.

It should be understood that the signals DATA and DATA SAMPLE are each N bits wide to represent every channel being displayed, i.e., N channels. There are also N initial data sample registers 24 and current data sample registers 26, as well as change comparators 30 and change registers 32. For each channel, the only series of events that will lead to an absence of the CHANGE flag being set, is if every DATA SAMPLE for that channel during the timeslice is the same. At the end of the compression of the data for one timeslice, the change register 32 contains the CHANGED data summarizing the behavior of all of the displayed channels. A channel either changed or it did not change. If it did not change, then the initial data sample contains the information for determining whether the pixel should be displayed as a high or a low. The term "summarizing", as used herein, means to provide the correct display symbol information for the compressed pixel data. For example, providing the display symbol information which causes the upper most element of the pixel to be illuminated to represent a high logic state, providing the display symbol information which causes the bottom most element of the pixel to be illuminated to represent a low logic state, or providing the display symbol information which causes all of the elements of the pixel to be illuminated to represent an edge of a changing logic state.

If the CHANGED data indicates that no change has occurred, then the INITIAL DATA value, high or low, is displayed in the current timeslice column for that channel. If the CHANGED data indicates that a change has occurred, then a vertical transition is displayed in that timeslice column on that channel by illuminating all of the display pixels in the vertical line. Otherwise, the initial DATA SAMPLE value, high or low, is displayed. This value is held by the Initial Data Sample 24. If the circuitry is being used for violations, the same principles apply, and either a violation occurred sometime during the timeslice or it did not occur, and a displayed symbol reflects the operative condition.

As noted, the circuitry of FIG. 2 is used for compression of data. The same circuitry can also be to process violation data. Glitches or setup and hold violations can be monitored and stored in the same manner as state data, during the time when the timestamp values comparisons indicate that a particular timeslice is being compressed. In one mode of operation of the logic analyzer, i.e., asynchronous operation, the violation circuitry can process glitches, while in another mode, i.e., synchronous operation, the violation circuitry can process setup and hold violations. In the field of logic analyzers, a glitch is defined as two or more transitions of the samples within a given pixel.

While a preferred one-pass embodiment of the present invention has been shown and described thus far, it will be apparent to those skilled in the art that many changes and modifications may be made without departing from the invention in its broader aspects. For example, the circuitry shown in FIG. 3 is similar to that of FIG. 2 except that it has been split to allow it to reside in different locations. This results in a two-pass system. In the one-pass system, the number of samples for a given pixel is determined by performing a count, and before incrementing to the next count, the associated sample data for that particular count is evaluated. In the two-pass system, the total number of samples in the given pixel is determined before the data at each location is evaluated.

Referring to FIG. 3, all elements having similar reference numerals to elements in FIG. 2 have a similar purpose. FIG. 3 will not be described in detail. To transform the circuitry of FIG. 2 into that of FIG. 3, the circuit is broken into two portions at the INC signal, and a counter is installed in each portion. One skilled in the art will recognize that each portion may reside on a different chip. Sample Counter 319 counts up using INC signals to determine the number of addresses in the timeslice, while Sample Counter 321 counts down from the number of addresses in the timeslice to control how many data locations are to be compressed. Some means, hardware or software, must be supplied for transmitting the final count value of counter 319 to the counter 321.

Figure 4:
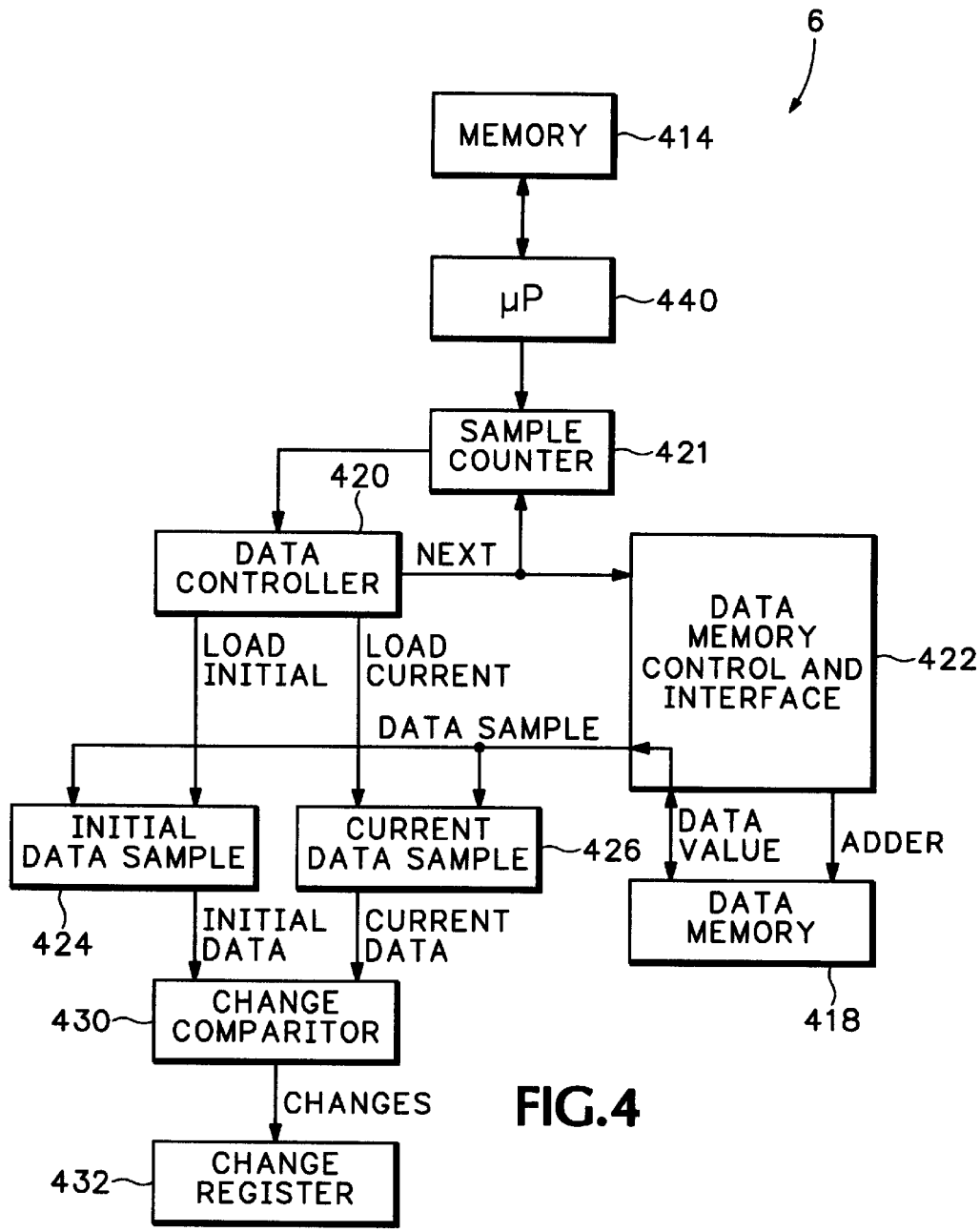
FIG. 4 is a block diagram of yet another embodiment of circuitry used for compressing waveform data in accordance with the invention.

Referring to FIG. 4, all elements having similar reference numerals to elements in FIGS. 2 and 3 have a similar purpose. FIG. 4 will not be described in detail. To transform the circuitry of FIG. 2 into that of FIG. 4, elements 310, 312, and 316, which determined the number of samples per pixel (or timeslice), are replaced by a microprocessor 440, which reads data from memory 414, and a counter 421 is installed. One skilled in the art will recognize that microprocessor 440 may be a low power on-board compute engine, or in fact may be the main PC. Microprocessor 440 begins at the starting data memory address of the pixel and searches for the address of the ending timestamp to determine the number of addresses in the timeslice. One skilled in the art will recognize that this search can be accomplished quickly by means of various search strategies, such as, a binary search, and need not entail reading from every memory location. When the address of the ending timestamp is determined, Sample Counter 421 is programmed with that value, and thereafter counts down from the number of addresses in the timeslice to control how many data locations are to be compressed. Note that the data compression is still handled in hardware in the embodiment of FIG. 4 to gain the speed advantage of this arrangement.

What has been described is an apparatus that allows the evaluation for display of approximately 400 Mbytes of data in approximately ten seconds, as opposed to a processing time of four to five minutes if done entirely in software. This significant time reduction is due to the use of dedicated hardware circuitry that is capable of performing an evaluation of a sample in as little as 12 nanoseconds. Use of the subject invention allows the user to zoom in, zoom out, and scroll through the waveform data with a fast response time.

The terms microcomputer, compute engine, microprocessor, and controller are used interchangeably herein. The terms timeslice and pixel duration are used interchangeably herein. The claims that follow are intended to cover all changes and modifications as are permitted by the patent laws of the respective countries in which this patent is granted.

What is claimed is:

1. Apparatus for rapidly producing a compressed display of data in a logic analyzer, comprising:

a memory for storing logic state samples representing the behavior over time of one or more input signals;

a starting memory address register for storing a starting memory address;

an ending time stamp comparator for comparing a current time stamp with an ending time stamp to determine the last sample associated with a given pixel, said starting address and said ending timestamp defining a timeslice;

hardware circuitry for compressing data descriptive of waveform activity during said timeslice by using said hardware circuitry to compare current sample data with reference data; and further comprising a display screen for displaying waveform data; and a controller for controlling said display screen;

said controller loading said starting memory address into said starting memory address register;

said controller loading said ending time stamp into said comparator;

said hardware circuitry evaluating data read from said acquisition memory beginning at said starting address, incrementing said memory address and reading a current timestamp until said current timestamp value exceeds said ending timestamp value;

said controller receiving only said compressed waveform data for display.

2. Apparatus according to claim 1, wherein i. said waveform data for said pixel is evaluated after a total count of samples for said pixel is determined.

3. Apparatus according to claim 1, wherein a. said waveform data for said pixel is evaluated during a process in which a total count of samples for said pixel is determined.

* * * * *